United States Patent
Arai et al.

(10) Patent No.: US 11,576,265 B2
(45) Date of Patent: Feb. 7, 2023

(54) MANUFACTURING METHOD FOR PRINTED CIRCUIT BOARD AND LASER PROCESSING MACHINE

(71) Applicant: OFUNA ENTERPRISE Japan Co., Ltd., Tokyo (JP)

(72) Inventors: Kunio Arai, Kanagawa (JP); Yasuhiko Kanaya, Tokyo (JP)

(73) Assignee: OFUNA ENTERPRISE JAPAN CO., LTD., Tokyo (JP)

( * ) Notice: Subject to any disclaimer, the term of this patent is extended or adjusted under 35 U.S.C. 154(b) by 468 days.

(21) Appl. No.: 16/728,265

(22) Filed: Dec. 27, 2019

(65) Prior Publication Data

US 2020/0214138 A1 Jul. 2, 2020

(30) Foreign Application Priority Data

| Jan. 1, 2019 | (JP) | JP2019-008844 |
| May 22, 2019 | (JP) | JP2019-107470 |
| Aug. 26, 2019 | (JP) | JP2019-165755 |

(51) Int. Cl.
*H05K 3/00* (2006.01)
*B23K 26/082* (2014.01)
(Continued)

(52) U.S. Cl.
CPC ......... *H05K 3/0038* (2013.01); *B23K 26/064* (2015.10); *B23K 26/082* (2015.10);
(Continued)

(58) Field of Classification Search
CPC .............. B23K 26/402; B23K 26/0624; B23K 26/082; B23K 26/064; B23K 2103/18;
(Continued)

(56) References Cited

U.S. PATENT DOCUMENTS

| 6,034,349 A * | 3/2000 | Ota | B23K 26/082 |
| | | | 219/121.73 |
| 2001/0027964 A1 * | 10/2001 | Isaji | H05K 3/0035 |
| | | | 219/121.62 |
| 2004/0104042 A1 * | 6/2004 | Takase | H05K 3/462 |
| | | | 361/792 |

FOREIGN PATENT DOCUMENTS

| CN | 101372071 | 2/2009 |
| JP | 11-245071 | 9/1999 |

(Continued)

*Primary Examiner* — Dana Ross
*Assistant Examiner* — Kuangyue Chen
(74) *Attorney, Agent, or Firm* — Wenderoth, Lind & Ponack, L.L.P.

(57) ABSTRACT

A manufacturing method for a printed circuit board includes: passing a first laser beam output from a laser output device through a first aperture so as to define an outer diameter of the first laser beam, positioning the first laser beam by an optical axis positioning device including a galvano device and an fθ lens, and irradiating the printed circuit board with the first laser beam such that a through-hole is formed in a copper layer; and passing a second laser beam output from the laser output device through a second aperture so as to define an outer diameter of the second laser beam whereby a diameter of the second aperture is smaller than a diameter of the first aperture, positioning the second laser beam by the optical axis positioning device, and irradiating the printed circuit board with the second laser beam such that an insulating layer is processed.

2 Claims, 12 Drawing Sheets

(51) Int. Cl.
*B23K 26/064* (2014.01)
*B23K 103/00* (2006.01)
*B23K 101/42* (2006.01)
*B23K 103/12* (2006.01)

(52) U.S. Cl.
CPC ...... *B23K 2101/42* (2018.08); *B23K 2103/12* (2018.08); *B23K 2103/50* (2018.08); *H05K 2203/107* (2013.01)

(58) Field of Classification Search
CPC .......... B23K 2103/56; B23K 2103/172; B23K 2103/50; B23K 2101/42; B23K 2103/12; B23K 26/066; B23K 26/0643; B23K 2101/40; B23K 26/384; H05K 2203/107; H05K 2203/1476; H05K 3/0035; H05K 3/0038
See application file for complete search history.

(56) References Cited

FOREIGN PATENT DOCUMENTS

| | | |
|---|---|---|
| JP | 2000-84692 | 3/2000 |
| JP | 2001-251054 | 9/2001 |
| JP | 2003-204137 | 7/2003 |

\* cited by examiner

Prior Art

Prior Art

Prior Art

MANUFACTURING METHOD FOR PRINTED CIRCUIT BOARD AND LASER PROCESSING MACHINE

CROSS-REFERENCE TO RELATED APPLICATIONS

This application claims the benefit of Japanese Patent Application No. 2019-8844, filed Jan. 1, 2019, Japanese Patent Application No. 2019-107470, filed May 22, 2019, and Japanese Patent Application No. 2019-165755 filed Aug. 26, 2019, which are hereby incorporated by reference herein in their entirety.

BACKGROUND OF THE INVENTION

Field of the Invention

The present invention relates to a manufacturing method for a printed circuit board in which a blind hole and/or a through-hole is formed, and a laser processing machine. The blind hole (hereinafter, simply referred to as a hole) is a hole for connecting a copper layer on a front surface (herein after referred to as a front side copper layer. a front surface copper layer or simply a copper layer) and a lower copper layer on a lower layer which is disposed below an insulating layer and is exposed in the hole bottom (herein after referred to as a bottom copper layer for a build-up type printed circuit board and a back side surface for a double sided board) to each other. The through-hole is a hole for connecting the front side copper layer and the back side copper layer (herein after also referred to as a back surface copper layer) to each other. The through-hole is formed by processing from the front and back side surfaces of the printed circuit board.

Description of the Related Art

A build-up type printed circuit board is formed by alternately laminating copper layer as a conductor and an insulating layer formed of a resin containing a glass fiber or a filler (hereinafter, simply referred to as an "insulating layer") in general. For the purpose of an increase in absorption of laser beam, not only the copper layer having a thickness of 5 to 12 μm being subjected to a surface treatment (called a black oxide treatment or a brown treatment) but also a glossy surface (shinny surface) having a thickness of 1.5 to 2 μm being not subjected to the surface treatment is used. In addition, a thickness of an insulating layer is 20 to 200 μm. When a hole is processed by a carbon dioxide laser beam, a hole of 40 to 120 μm is processed by connecting the front side copper layer and the bottom copper layer to each other by plating for interlayer connection, and when a circuit pattern is formed, a hole of 120 to 250 μm, which is used as a reference hole, is processed, respectively. A processing result has been required to facilitate a plating process in the following process as a laser processing.

Next, a configuration of a laser processing machine in the prior art will be described.

FIG. 9 is an overall view of a laser processing machine in the prior art.

A laser oscillator 1 outputs a pulse like laser beam 2. A beam diameter adjusting device 100 arranged between the laser oscillator 1 and a plate 3 is a device for adjusting an energy density of the laser beam 2, and adjusts the energy density of the laser beam 2 by changing an outer diameter of the laser beam 2 output from the laser oscillator 1. That is, energy of the laser beam 2 emitted from the front and rear of the beam diameter adjusting device 100 does not change. Therefore, since the laser beam 2 emitted from the beam diameter adjusting device 100 can be regarded as a laser beam 2 output from the laser oscillator 1, the beam diameter adjusting device 100 and the laser oscillator 1 are collectively referred to as a laser output device 110. Note that, the beam diameter adjusting device 100 may not be used.

The plate 3 arranged between the laser oscillator 1 and a galvanometer mirror 5a is formed of a material (for example, copper) which does not let the laser beam 2 transmit, and a plurality of apertures (windows, in this case, circular through-holes) 4 are selectively formed at a predetermined position. The plate 3 is driven by a driving device (not illustrated) and an axis of the selected aperture 4 is positioned coaxially with an axis of the laser beam 2. A galvano device 5 includes a pair of galvanometer mirrors 5a and 5b, can be rotated around a rotation shaft as indicated by an arrow in FIG. 9, and can position a reflection surface at an arbitrary angle. Positioning time required for the position of the galvanometer mirrors 5a and 5b is about 0.4 ms (2.5 kHz) in average. An fθ lens (a focusing lens or a condensing lens) 6 is held by a processing head (not illustrated). The galvanometer mirrors 5a and 5b and the fθ lens 6 constitute an optical axis positioning device to position an optical axis of the laser beam 2 at a predetermined position of a printed circuit board 7, and a scanning area (that is, processing area) 8 has a size of about 50 mm×50 mm determined by a rotation angle of the galvanometer mirrors 5a and 5b and a diameter of the fθ lens 6. The printed circuit board 7 as a workpiece is fixed to an X-Y table 9. The printed circuit board 7 includes at least two copper layers 7c and one insulating layer 7z. A control device 10 controls the laser oscillator 1, the beam diameter adjusting device 100, the driving device of the plate 3, galvanometer mirrors 5a and 5b, and the X-Y table 9 according to an input control program.

Next, a processing procedure of a laser processing machine in the prior art will be described.

FIG. 10 is a flowchart illustrating a processing procedure of a laser processing machine in the prior art.

The control device 10 reads a processing program and moves the X-Y table 9 to face an initial scanning area 8 to the ID lens 6 (procedure Si 0). Then, the aperture 4 corresponding to a diameter of the hole processed first in the scanning area 8 is selected, an axis of the selected aperture 4 is positioned coaxially with an axis of the laser beam 2, and an energy density of the laser beam 2 is changed by the beam diameter adjusting device 100, as necessary (procedure S20). Then, first, a hole (hereinafter; referred to as a window) is made at the specified position in the front side copper layer 7c in the scanning area 8 (procedures S50 and S60). That is, the outer diameter of the laser beam 2 output from the laser output device 110 is shaped by the aperture 4, and the axis of the laser beam 2 condensed by the optical axis positioning device including the galvanometer mirrors 5a and 5b and the fθ lens 6 is positioned to let the laser beam be incident on the printed circuit board 7. The front side copper layer 7c is vaporized by the laser beam 2 to firm a window. In this case, in order to prevent deterioration of the insulating layer 7z corresponding to the window, that is, the insulating layer 7z exposed on the surface by forming the window (hereinafter, referred to as "window portion insulating layer 7z"), the window is formed by irradiating with the laser beam 2 once (that is, by one-pulse irradiation). Since a temperature of the window portion insulating layer 7z immediately after forming the window is high, when the insulating layer 7z of the front side copper layer 7c is processed after processing the front side copper layer 7c, there is a high possibility that a hollow in the insulating layer 7z disposed under an outer edge of the window of the front side copper layer 7c (the outer edge of the window portion insulating layer 7z expands to the area under the front side copper layer 7c at the outer edge of the window, such that the front side copper layer 7c at the outer edge of the window is overhung with respect to the insulating layer 7z. Hereinafter, simply referred to as a hollow) occurs or an inside of the hole is a beer barrel shape, which is described below. Then, an unprocessed hole to be processed in the front side copper layer 7c in the scanning area 8 is processed first.

After the window processing is ended, all the insulating layers 7z at the position specified in the scanning area 8, that is, the window portion insulating layers 7z are processed to form a hole. When the insulating layer 7z is processed with the excessive energy, the possibility that the hollow occurs or the inside of the hole is a beer barrel shape is high. Therefore, by repeating the processing of one hole with a plurality of pulses of a pulse width Pwz and the processing of the next hole if the laser beam 2 is shot to one hole by one pulse, the insulating layer 7z is processed to form each hole. That is, the specified number of times N in which the insulating layer 7z is shot first by the laser beam 2 is stored first, and the number of shots i is set to 1 (procedures S80 and S90). Then, all the window portion insulating layers 7z in the scanning area 8 are shot by the laser beam 2 by one pulse (procedures S100 and S110). If all the window portion insulating layers 7z in the scanning area 8 are shot by the laser beam 2, the number of shots i is set to i+1, and the specified number of times N and the number of shots i are compared with each other (procedures S120 and S130). If i≤N, procedure S100 is performed, and if i>N, procedure S500 is performed. In procedure S500, it is checked whether or not there are unprocessed holes having different diameters in the scanning area 8, and if there is an unprocessed hole, an operation of procedure S20 is performed. In addition, it is checked whether or not there is an unprocessed scanning area 8 if there is no unprocessed hole (procedure S510), and if there is an unprocessed scanning area 8, an operation of procedure S10 is performed, and if there is no unprocessed scanning area 8, the processing is ended.

Here, a characteristic of a case where the laser beam 2 is a carbon dioxide laser beam will be described.

FIG. 11 is a graph explaining an output of the laser oscillator 1, an upper part represents an output of a high frequency RF which drive the laser oscillator 1 by control signal from system controller (not illustrated). In addition, a lower part represents an output waveform of the laser beam 2 by one pulse, a vertical axis represents an output pulse and a horizontal axis represents a time, respectively. When the laser oscillator 1 is activated (time T0), the high frequency RF is applied to a laser medium in the laser oscillator 1 and laser gain charge in the medium is initiated. When the gain medium level reach to specified high level, the laser beam 2 is output (time T1). And output power of the laser beam 2 is rapidly rise (time Tj), then output power of the laser beam 2 is reduced (time Td), and output power rise again by continuous gain charging to Time T2 in the oscillator. Even when the laser oscillator 1 is stopped, that is, application of the high frequency RF is stopped (time T2), the energy is continuously output while attenuating, an output level becomes zero at time T3. In FIG. 11, pulse energy Ep by one pulse indicated by an Oblique line is a total amount of energy in a period from time T1 which is duration in one pulse to time T3 at which the output level becomes zero. However, the pulse width Pw is controlled as a period from time T1 to time T2 in practical use. That is, for example, when the pulse width Pw is 2 µs, time T2 is a time elapsing 5 µs from time T0. A period from time T0 to time T1 is about 3 µs±0.3 µs which varies depending on a pulse frequency (pulse period). A laser oscillation frequency of the laser oscillator 1 is about 5 kHz (pulse period of 200 µs) in maximum.

Next, a procedure of selecting a diameter of the aperture 4 will be described. Since the laser beam 2 is projected (condensed) by the fθ lens 6 by reducing an aperture diameter, the output distribution of the laser beam 2 forms a bell-shaped curve similar to a Gaussian distribution curve with an axis of the laser beam 2 as an axis of symmetry. As described above, the front side copper layer 7c is vaporized by the laser shot to form a window. As the diameter of the aperture 4, a desired hole diameter, that is, a diameter of the window portion is selected so that a size thereof is a copper vaporization threshold. For this reason, when the diameters of the processed holes are different, the aperture having a different diameter is selected. As such, it is not necessary that a height of the ID lens 6 constituting the optical axis positioning device moves in a vertical direction. Accordingly, not only processing accuracy but also workability is improved, Some devices have been proposed as an exchanging device of the aperture 4 (see JP-A-2000-84692).

FIGS. 12A to 12D are cross-sectional views illustrating an example of a shape of hole formed by laser processing.

When a density of glass fiber of the insulating layer is low and the inside of the hole is irradiated with the laser beam 2 of the final pulse reflected to the bottom copper layer 7c or when the formed hole is deep, a resin of a hole wall surface is hollowed due to spatters and debris produced in the hole and a diameter of the intermediate portion of the hole in a depth direction is wider than a diameter thereof in a vertical direction, such that the hole wall surface becomes a beer barrel-shaped hole as illustrated in FIG. 12A. If the hole is a beer barrel shape, a void (a hole inlet is closed during the plating processing and thus is in a state in which plating liquid is enclosed in the hole) is likely to occur at the time of plating in the fallowing process as illustrated in FIG. 1213, which mainly causes a printed circuit board defect.

As illustrated in FIG. 12C, when a through-hole (through-hole for connecting a front surface copper layer and a back surface copper layer of a double-sided board to each other) is formed, when a shape of the hole in the front surface and a shape of the hole in the rear surface are not uniformly symmetrical, or when a diameter of the intermediate portion of the hole varies (about 10 µm), one of plated finish surfaces is recessed and the other surface thereof is likely to be convex. For this reason, a thickness of plating is increased, such that it is necessary to finish the surfaces smoothly by a dedicated polishing process.

As illustrated in FIG. 12D, not only the window portion insulating layer 7z but also an insulating layer 7z surrounds the window portion insulating layer 7z is hollowed by heat, a recess 11 is formed in many cases. If a diameter Dk of the recess 11 is larger than a diameter D of the window by 15 µm or more, the front side copper layer 7c has an overhang of 7.5 µm or more with respect to the hole formed in the insulating 7z. As a result, a void in the hole is likely to occur at the time of plating in the following process. Further, when the diameter Dk of the recess 11 is 15 µm or more than the diameter D of the window, peeling (a state in which an air layer is present between the front side copper layer 7c and the insulating layer 7z) may occur between the front side copper layer 7c and the insulating layer 7z, or a fine crack (hereinafter, simply referred to as a crack) may occur in a thickness direction of the insulating layer 7z. If the crack occurs in one or both of the adjacent holes, a peeling portion or the crack is plated at the time of plating in the following process, such that a short circuit occurs between the adjacent holes of the front side copper layer 7c. Therefore, it is necessary to prevent the occurrence of such a crack. Accordingly, although the specified number of times N increases, the energy per pulse is reduced to have a high quality processed hole wall surface.

In order to correspond to a high-density semiconductor mounted on the printed circuit board 7, it is required to process a hole having a shape capable of accurately performing the plating. That is, the following (1) to (9) are required.
(1) Variation in diameter of the window or the hole formed in the insulating layer 7z is 5% or less
(2) The hole formed in the insulating layer 7z is a truncated cone in which a diameter of the bottom surface is 80% or more of a diameter of a top surface
(3) The hole wall surface is made smooth so that glass fiber does not protrude to the hole wall surface, and
in addition to this,
(4) A hollow in the outer edge of the window portion insulating layer 7z (an overhang of the front side copper layer 7c) is 7.5 μm or less (for the diameter, a window diameter+15 μm)
(5) There is no peeling or crack between the front side copper layer 7c in the vicinity of the window and the insulating layer 7z
(6) The hole diameter is further reduced
(7) A distance between adjacent holes is about two times the hole diameter (currently, three to four times the hole diameter)
(8) A hole bottom is not damaged
(9) When a through-hole is formed, variation in diameter of the intermediate portion of the hole is reduced As described above, when the insulating layer 7z is processed with the excessive energy at once, the hollow occurs or the inside of the hole is a beer barrel shape. Accordingly, by reducing the pulse width Pwz, that is, shooting the laser beam 2 with small pulse energy in plural times, the (1) to (3) have been solved to some extent. However, since time T1 varies about ±0.3 μs, so when the pulse width Pwz is, for example, 1.5 μs, the mew is insufficient, such that a diameter of a hole bottom is reduced in some cases. When the pulse width Pwz is increased in order to avoid such a state, there is a high possibility that the hollow occurs or a hole inner portion is a beer barrel shape. In addition, if the number of shots is increased without changing the pulse width Pwz, a time required for the position of the above-described galvanometer mirrors 5a and 5b is about 0.4 ms (frequency of 2.5 kHz) in average, and thus a processing time for one hole is increased by 0.4 ms each time the number of shots is increased. Therefore, further improvement in a hole quality and reduction in the processing time has been required. In addition, improvement has also been required for the (4) to (9).

SUMMARY OF THE INVENTION

According to a first aspect of the present invention, a manufacturing method for a printed circuit board for positioning a laser beam output from a laser output device by using a galvano device and an fθ lens and forming a hole in the printed circuit board including a copper layer and an insulating layer, the method includes forming a through-hole (a window) in the copper layer by the laser beam whose outer diameter is shaped by a first aperture, and processing the insulating layer by the laser beam whose outer diameter is shaped by a second aperture having a smaller diameter than the first aperture.

According to a second aspect of the present invention, a manufacturing method for a printed circuit board for positioning a laser beam output from a laser output device by using a galvano device and an fθ lens and forming a hole in the printed circuit board including a copper layer and an insulating layer, the method includes forming a through-hole in the copper layer by the laser beam whose outer diameter is shaped by a first aperture, and processing the insulating layer by the laser beam shaped by a second aperture such that a diameter of the laser beam contributing to the processing of the insulating layer is equal to or less than a diameter of the through-hole.

According to a third aspect of the present invention, a laser processing machine includes a laser output device, a laser positioning device including a galvano device and an fθ lens and configured to position an irradiation position of a laser beam output from the laser output device, a first plate including a plurality of apertures having different diameters and arranged between the laser output device and the galvano device in an axial direction of the laser beam, a first plate positioning device configured to position an axis of each of the apertures provided in the first plate coaxially with an axis of the laser beam, a second plate including at least one aperture of which an axis is parallel with the axis of the laser beam and arranged between the first plate and the galvano device in the axial direction of the laser beam, a second plate positioning device configured to move the second plate in a direction perpendicular to the axis of the laser beam and position the second plate at a processing position where an axis of the aperture of the second plate is coaxial with the axis of the laser beam and a retreat position where the second plate does not interfere with the laser beam, and a control device configured to control the first and second plate positioning devices such that when the copper layer is processed, the first plate is positioned so that an axis of one aperture among the plurality of apertures in the first plate is coaxial with the axis of the laser beam and the second plate is moved to the retreat position, and when the insulating layer is processed, the second plate is positioned at the processing position to set an axis of the aperture having a diameter smaller than that of the aperture used for processing the copper layer coaxially with the axis of the laser beam.

Further features of the present invention will become apparent from the following description of exemplary embodiments with reference to the attached drawings.

DESCRIPTION OF THE EMBODIMENTS

Figure 1:
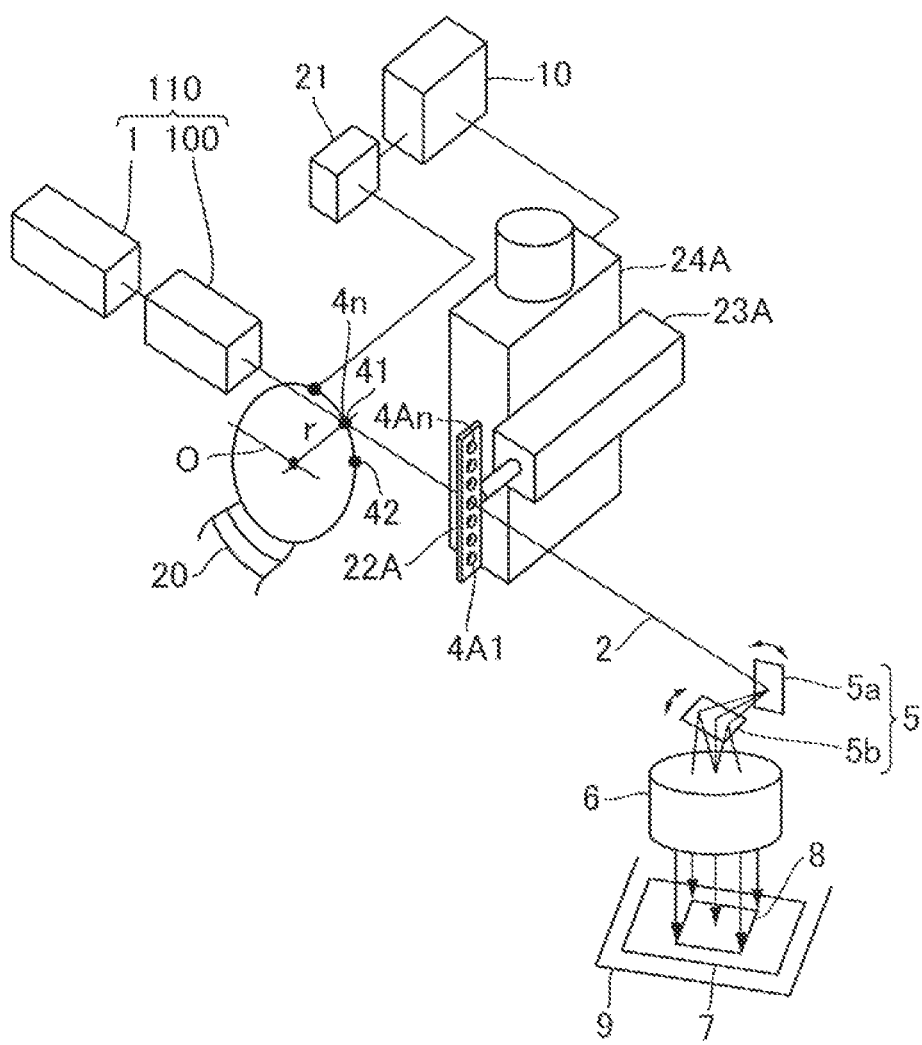
FIG. 1 is an overall view of a first laser processing machine in order to implement the present invention.

FIG. 1 is an overall view of a first laser processing machine in order to implement the present invention, the same object in the prior art or an object having the same function is denoted by the same reference numeral, so the detailed description thereof will not be repeated.

A disk-shaped large plate 20 having high reflectivity and formed of copper is arranged between the laser output device 110 and the galvanometer mirror 5a. Apertures 41 to 4n having different diameters are arranged on the circumference having a radius r from a rotation axis O of a large plate 20 so that the hole having a diameter of 40 to 250 µm can be processed. The apertures 41 to 4n are arranged at equal intervals in a circumferential direction. Each of the axes in the apertures 41 to 4n and the rotation axis O in the large plate 20 are parallel with each other. The rotation axis O of the large plate 20 is parallel with the axis of the laser beam 2 and positioned at a distance r. The large plate 20 is held so as to be rotated by a large plate positioning device 21 and freely positioned in a direction of rotation. The large plate positioning device 21 is connected to a control device 10.

A plate 22A having apertures 4A1 to 4An having the same number of the apertures 41 to 4n provided in the large plate 20 is arranged between the large plate 20 and the galvanometer mirror 5a in a direction perpendicular to the axis of the laser beam 2. A hole diameter of each of the apertures 4A1 to 4An is smaller than a hole diameter of each of the corresponding apertures 41 to 4n. The plate 22A is supported by a first linear motion device 23A moving in a linear direction. The plate 22A is positioned at a position (operation position) where one of the axes in the apertures 4A1 to 4An in one moving end of the first linear motion device 23A is coaxial with the axis of the laser beam 2. In addition, the plate 22A is positioned at a position (retreat position) where it does not interfere with the laser beam 2 in the other moving end of the first linear motion device 23A. The first linear motion device 23A is supported by a second linear motion device 24A in which a moving direction thereof is orthogonal to a moving direction of the first linear motion device 23A. The second linear motion device 24A is positioned at a position where one of the axes in the apertures 4A1 to 4An, which is in the operation position, is coaxial with the axis of the laser beam 2. As a result, one of the axes in the apertures 4A1 to 4An used for processing is positioned at a processing position. That is, a positioning device of the apertures 4A1 to 4An is constituted by the first linear motion device 23A and the second linear motion device 24A. The first linear motion device 23A and the second linear motion device 24A are connected to the control device 10, respectively. Here, an operating speed of the first linear motion device 23A is much higher than an operating speed of the large plate positioning device 21.

The large plate 20 including a plurality of apertures 41 to 4n having different diameters can be referred to as a first plate arranged between the laser output device 110 and the galvano device 5 in an axial direction of the laser beam. In addition, the plate 22A including at least one of apertures 4A1 to 4An of which an axis is parallel with the axis of the laser beam can be referred to as a second plate arranged between the first plate and the galvano device 5 in the axial direction of the laser beam.

The large plate positioning device 21 can constitute a first plate positioning device configured to position each of the axes in the apertures 41 to 4n provided in the first plate 20 coaxially with the axis of the laser beam. Further, the first linear motion device 23A and the second linear motion device 24A can constitute a second plate positioning device moving the second plate 22A in the direction perpendicular to the axis of the laser beam and positioning the second plate at the processing position where an axis of the aperture of the second plate is coaxial with the axis of the laser beam and the retreat position where the second plate does not interfere with the laser beam. The first and second plate positioning devices are controlled by the control device 10. The second plate is not necessarily provided with the plurality of apertures as in the present embodiment. That is, the second plate may be a plate including n apertures (where n is a positive integer) of which each of the axes is capable of being positioned coaxially with the axis of the laser beam.

Next, an operation of a manufacturing method for the printed circuit board by the laser processing machine will be described.

Figure 2:
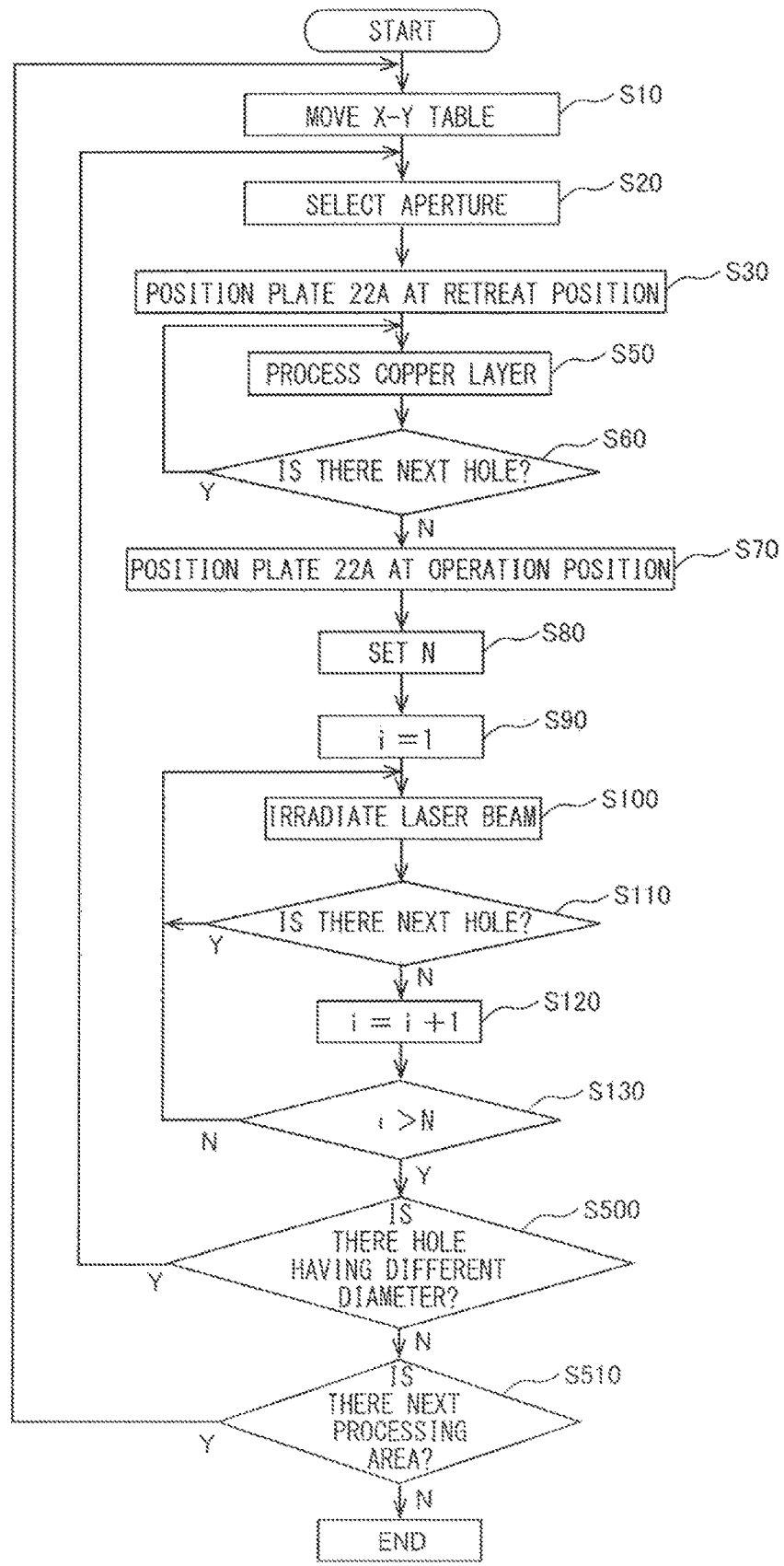
FIG. 2 is a flowchart illustrating a processing procedure of the first laser processing machine according to the present invention.

FIG. 2 is a flowchart illustrating a processing procedure of the first laser processing machine according to the present invention.

The control device 10 reads a processing program and moves the X-Y table 9 to face an initial scanning area 8 to the fθ lens 6 (procedure S10) In addition, the aperture of the large plate 20 corresponding to a diameter of the hole processed first is selected in a scanning area 8 (at least one of the apertures 41 to 4n. Hereinafter, the selected aperture is referred to as an aperture 4s), an axis of the aperture is positioned coaxially with an axis of the laser beam 2, and an energy density of the laser beam 2 is changed by a beam diameter adjusting device 100, as necessary (procedure S20). When the plate 22A is positioned at the operation position, the second linear motion device 24A is operated so that the axis of the aperture used at the time of processing the insulator in the apertures 4A1 to 4An (hereinafter, the selected aperture is referred to as a first aperture or an aperture 4As) coincides with the axis of the laser beam 2, and the plate 22A is positioned at the retreat position (procedure S30). Then, the window is processed by the laser beam whose outer diameter is shaped by an aperture 4s all the front side copper layer 7c at the position specified in the scanning area S (procedures S50 and S60). That is, the outer diameter of the laser beam 2 output from the laser output device 110 is shaped by the aperture 4s, and the axis of the laser beam 2 is positioned by an optical axis positioning device including galvanometer mirrors 5a and 5b and the fθ lens 6 to let the laser beam be incident on a printed circuit board 7. Similar to the prior art, the window is formed by shooting the laser beam 2 once (that is, one-pulse shot), and an unprocessed hole to be processed in the front side copper layer 7c in the scanning area 8 is processed. In other words, the optical axis positioning device may be a laser positioning device including the galvano device 5 and the fθ lens 6 and positioning an irradiation position of the laser beam output from the laser output device 110.

After the processing of the front side copper layer 7c is ended, the plate 22A is positioned at the operation position, that is, an axis of the aperture 4As using when the insulator is processed coincides with the axis of the laser beam 2 (procedure S70). Then, the window portion insulating layer 7z in the scanning area 8 is processed by the laser beam whose outer diameter is shaped by the second aperture 4As of the plate 22A having a smaller diameter than the aperture 4s to form a hole. That is, the specified number of times N in which the insulating layer 7z is shot by the laser beam 2 is stored first, and the number of shots i is set to 1 (procedures S80 and S90). Then, all the window portion insulating layers 7z in the scanning area 8 are shot by the laser beam 2 by one pulse (procedures S100 and S110). If all the window portion insulating layers 7z in the scanning area 8 are shot by the laser beam 2, the number of shots i is set to i+1, and the specified number of times N and the number of shots i are compared with each other (procedures S120 and S130). If i≤N, procedure S100 is performed, and if i>N, procedure S500 is performed. In procedure S500, it is checked whether or not there are unprocessed holes having different diameters in the scanning area 8, and if there is an unprocessed hole, an operation of procedure S20 is performed. In addition, it is checked whether or not there is an unprocessed scanning area 8 if there is no unprocessed hole (procedure S510), and if there is an unprocessed scanning area 8, an operation of procedure S10 is performed, and if there is no unprocessed scanning area 8, the processing is ended.

Next, processing in a case where the window having a same diameter as that in the prior art is processed in the present embodiment, will be described in detail.

In the present application, when a diameter of the window is D, a diameter of the hole made in the insulator is smaller than the diameter D, for example, is processed as a diameter of 0.7 D. By doing so, an amount of the insulator to be removed is 49% in the prior art, that is, about a half, and thus, when the amount of the insulator is processed by six pulses in the prior art for example, it is possible to process the amount of the insulator by three pulses of the energy which is the same as that in the present application. In this case, since the amount of the insulator is processed by the same energy as in the case of six pulses in the prior art, a quality of the processed hole wall surface does not deteriorate.

Since a diameter of the hole to be processed is smaller than a window diameter when the insulating layer 7z is processed, a diameter of a recess 11 is hardly expanded and no hollow occurs.

A case where the hole to be processed in the insulating layer is smaller than the window diameter is described, but when the hole to be processed is a hole having a smaller diameter, for example, 80 μm or less, it may be difficult to process a diameter of the hole to be processed in the insulating layer 7z to be smaller than the window diameter.

Such a case, the present inventors have realized that the problem can be solved by adjusting the diameter of the hole to be processed in the insulating layer 7z to the window diameter. That is, the outer diameter of the laser beam is shaped by the above-described second aperture such that the diameter of the laser beam contributing to the processing of the insulating layer is equal to or less than the diameter of the through-hole in the front side copper layer (window diameter), to thereby process the insulating layer. In addition, it was conceivable that by finding units for appropriately determining processing conditions of the insulating layer 7z which has been determined by trial and error in the prior art, the hole having a high quality can be processed and the processing conditions can be set in a short time. Thus, it was examined and analyzed the relationship between key process parameters (e.g., energy level) and the hole geometrical data obtained through experiment.

As a result, it was found that the processing result can be explained well if the processed data is arranged based on an energy level k in which the insulator is vaporized (hereinafter, simply referred to as an energy level k), an energy level g in which glass fiber consisting the insulating layer is vaporized (hereinafter, simply referred to as an energy level g), and an energy level j in which copper is vaporized (hereinafter, simply referred to as an energy level j). The surface of the insulating layer 7z is matched with the energy level g in which glass fiber constituting the insulating layer 7z is vaporized, such that it was confirmed that the hollow hardly occurs and the inside of the hole is not a beer barrel shape.

Hereinafter, based on the studies, a processing method according to the present invention will be described by including the review in the prior art.

Figure 3A:
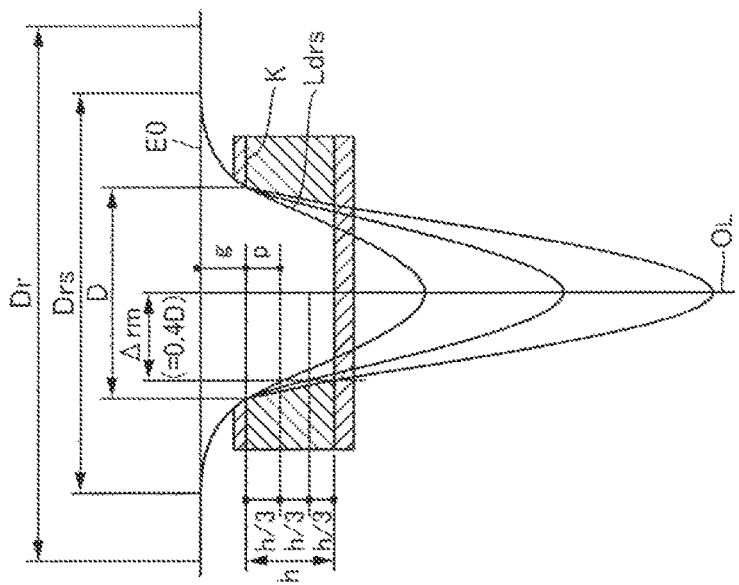
FIG. 3A is a view illustrating a prior processing process by using pulse energy Ep.
Figure 3B:
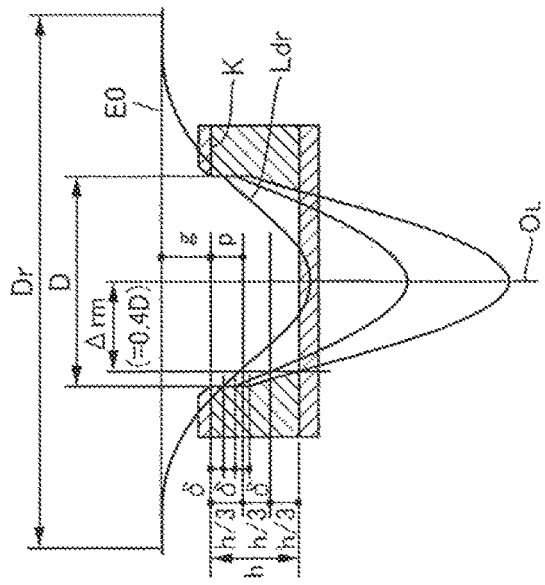
FIG. 3B is a view illustrating a prior processing process by using pulse energy Ep.
Figure 3C:
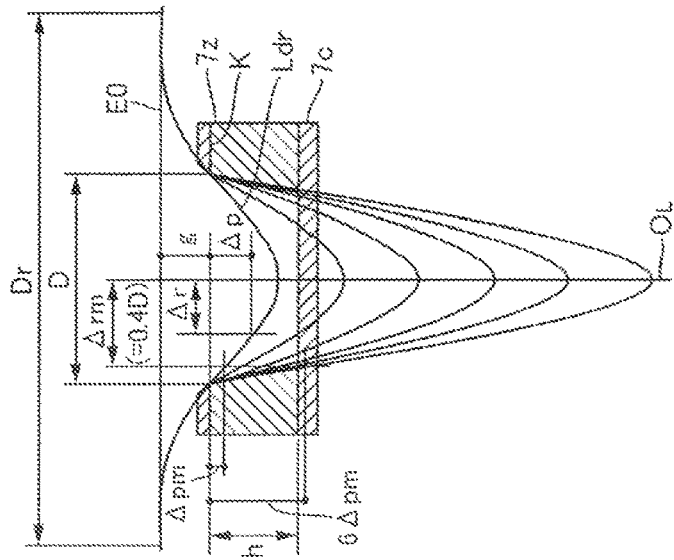
FIG. 3C is a view illustrating a processing process of the present embodiment by using pulse energy Ep according to the present embodiment.

FIGS. 3A to 3C are views illustrating a processing process by using pulse energy Ep. FIGS. 3A and 3B are views illustrating a case in the prior art and FIG. 3C is a view illustrating a case of the present invention. In FIGS. 3A to 3C, Dr is a focusing diameter of the aperture in the plate 20 in FIG. 1, that is, the aperture 4s, Drs is a focusing diameter of the selected aperture in the plate 22A in FIG. 1, that is, the aperture 4As, and D is a window diameter. In addition, a K surface is a top surface of the insulating layer 7z being in contact with a bottom surface of the front side copper layer 7c, and a thickness of the insulating layer 7z is set to h. In order to facilitate understanding, the insulating layer 7z has a flat surface without being affected by heat generated by the formation of window.

A. Typical Processing Example in Prior Art

An energy distribution curve Ldr is a curve illustrating spatial distribution of the pulse energy Ep having an outer diameter being shaped by the aperture 4s, and a height direction represents energy level. E0 is a position with the energy level of zero.

In a case of the ideal processing example, the pulse Pw is set so that a diameter of the energy level g in the energy distribution curve Ldr is the window diameter D of the K surface.

Here, in the energy distribution curve Ldr, an energy level obtained from the energy level g at a position of a radius Δr from an axis $O_L$ of the laser beam 2 is set to Δp. The radius Δr having a radius of 0.4 D from the axis $O_L$ is referred to as a "radius Δrm", and an energy level Δp in the radius of Δm is referred to as an "energy level Δpm". Assuming that if Δr=D/2, Δp is zero.

A surface layer portion of the insulating layer $7z$ is processed along the energy distribution curve Ldr by a first pulse, and the surface layer portion of the insulating layer $7z$ in the radius $\Delta r$ is processed by $\Delta p$ by the first pulse. The energy distribution curve Ldr of a second pulse is the same as that of the first pulse, but the surface layer portion of the insulating layer $7z$ at the position of the radius $\Delta r$ is already processed by $\Delta p$ by the first pulse. Therefore, the surface of the insulating layer $7z$ processed by the first pulse is processed by $\Delta p$, that is, is processed by $2\Delta p$. Thereafter, the processing proceeds by the number of specified pulses in the same manner, and as the processing proceeds, the processed hole wall surface approaches perpendicularly to the bottom surface. Then, the laser beam 2 is shot by nth-pulse laser beam until $n \times \Delta pm \geq h$, that is, until the diameter of the hole bottom is 0.8 D or more. In a case shown in FIGS. 3A, since 6 $\Delta pm$ is greater than a thickness h according to the calculation (that is, reaches the surface of the bottom copper layer $7c$), the processing is ended in the sixth pulse.

By doing so, since the hole wall surface does not exceed the energy level g, the hollow does not occur and a high quality hole can be processed. However, the processing time becomes long.

B. Processing Example in which Shortening Processing Time in Prior Art is Failed (Case where Workpiece as Described in A is Processed by Three Pulses for Shortening Processing Time)

Now, an energy level of the insulating layer $7z$ to be processed by h/3 is set to p. In order to process the hole in which a diameter of the hole bottom is 0.8 D or more by three pulses, a pulse width is determined so that the energy level of the energy distribution curve Ldr is set to an energy level (g+p) in the radius $\Delta rm$. In this case, an energy level of the window diameter D in the outer edge is smaller by the energy level $\Delta q$ ($\delta$ in terms of a processing amount) than the energy level (g+p) of the radius $\Delta rm$.

Because of the above setting, the energy level of the radius $\Delta rm$ is processed from the surface to a depth of h/3 by the first-pulse laser beam in the first pulse, from the surface to a depth of ⅔ h by the second-pulse laser beam and from the surface to a desired diameter of the bottom surface by the third-pulse laser beam. In addition, the energy level of the window diameter D in the outer edge is processed from the surface to a depth of (2 h/3−$\delta$) by the first-pulse laser beam, from the surface to a depth of (2 h/3−2$\delta$) by the second-pulse laser beam, and from the surface to the depth of (h−3$\delta$) by the third-pulse laser beam. The hole wall surface from the K surface to (h−3$\delta$) is perpendicular to the bottom surface of the hole. However, particularly, the hole wall surface is subjected to the energy level much higher than the energy level g by the first-pulse laser beam, and as a result, the insulating layer $7z$ is overheated and vaporized, such that the hollow occurs in the outer edge of the window. In addition, since the hole bottom becomes deep in the second pulse, a vaporized substance (particle) from the overheated insulating layer hardly splash out from the hole and the hollow is expanded. Further, the third-pulse laser beam not only makes the hollow larger, but also makes the intermediate portion of the hole into a beer barrel shape.

Thus, if the processing energy is increased simply, a high quality hole cannot be processed.

C. Processing Example in Case of Present Application

An energy distribution curve Ldrs is a curve illustrating spatial distribution of the pulse energy Ep having an outer diameter being shaped by the aperture 4As, and a height direction represents energy level. In the present application, the pulse width is determined so that as the energy distribution curve Ldrs, the energy level in the window edge surface of the K surface is set to an energy level g and the energy level of the radius $\Delta rm$ is set to the energy level (p+g).

The energy level of the radius $\Delta rm$ is processed from the surface to a depth of h/3 by the first-pulse laser beam, from the surface to a depth of ⅔ h by the second-pulse laser beam, and from the surface to a desired diameter of the bottom surface by the third-pulse laser beam. In addition, the hole wall surface gradually and perpendicularly approaches, but since the hole wall surface does not exceed the energy level g, no hollow can occur and high quality hole can be processed. Moreover the processing time can be shortened as compared with the prior all (in a case of six pulses in the prior art, reduced by 50%). The energy level of the radius $\Delta rm$ is set to an energy level (p+g), but if the energy level of the radius $\Delta rm$ is set to the energy level (p+g) or greater, the hole wall surface can further approach to a vertical surface.

Here, the diameter of the hole to be processed in the insulating layer $7z$ is set to a window diameter D, but it goes without saying that the diameter of the hole to be processed in the insulating layer $7z$ is smaller than the window diameter D.

In respective examples of the A, B, and C, the insulating layer $7z$ is not influenced by heat generated by the formation of window, but actually, a recess occurs on the surface, and thus the number of irradiation pulses is slightly reduced in many cases.

Next, influence of heat in the vicinity of the window at the time of the processing will be described.

Figure 4:
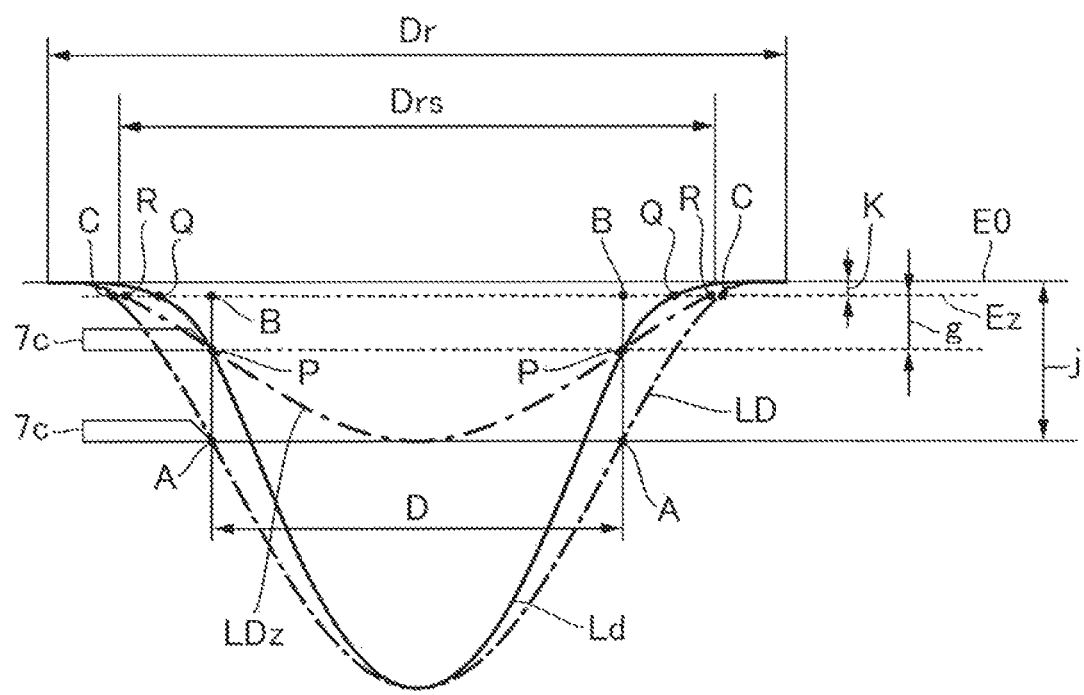
FIG. 4 is a view illustrating spatial distribution of the pulse energy Ep.

FIG. 4 is a view illustrating spatial distribution of the pulse energy Ep, and a horizontal axis represents a diameter and a vertical axis represents energy level. In FIG. 4, E0 is an energy level of zero, an energy level denoted by Ez is an energy level k in which the insulator is vaporized, an energy level denoted by Eg is an energy level g in which glass fiber constituting the insulating layer is vaporized, and an energy level denoted by A-A is an energy level j in which copper is vaporized. In addition, the energy distribution curve LD indicated by alternate long and short dash line illustrates a case where a focusing diameter of the aperture 4s is Dr, and the energy distribution curve Ld indicated by solid line illustrates a case where a focusing diameter of the aperture 4As is Drs, respectively. Here, a diameter of the energy level j in which copper is vaporized in the energy distribution curve LD is D (that is, a window diameter), and a diameter of the energy level g in which glass fiber in the insulating layer is vaporized in the energy distribution curve Ld is D.

Here, a point in which the energy distribution curve LD meets at the energy level Ez is set to C, and a point in which the energy distribution curve Ld meets at the energy level Ez is set to Q. In addition, a position corresponding to the diameter D of the energy level Ez is set to B-B. In a case of the energy distribution curve Ld, energy in which a cross section viewed from the insulator is surrounded by an approximate triangle PBQ is supplied to an outer periphery of the window. In other words, if the energy distribution curve is an energy distribution curve LDz having the energy level g in the outer periphery of the window by reducing the pulse width Pw which is adopted at the time of processing the front side copper layer (the energy distribution curve is the energy distribution curve LD, a removal amount of the insulator is reduced by one pulse, and thus it is necessary to increase the number of pulses as is clear from FIG. 4. In addition, the energy distribution curve LDz meets at the energy level Ez and points R, and since energy in which a cross section viewed from the insulator is surrounded by an approximate triangle PBR which is larger than the approximate triangle PBQ is supplied to the outer periphery of the window, influence of heat is increased. As illustrated in FIGS. 3A to 3C, when the selected energy level is greater than the energy level g, the hollow is likely to occur and the inside of the hole is likely to be a barrel shape.

In a case where the energy level k coincides with the window diameter D, the occurrence of the recess 11 can be suppressed, but glass fiber is likely to remain in the processed hole, and thus it can be impracticable.

Here, a specific method of confirming an energy level k and an energy level g of a "glass epoxy substrate" which is widely used as a printed circuit board, will be described.

The glass epoxy substrate, as a printed circuit board, is formed by attaching copper foils (copper layers) to FR4, as a base material, which is obtained by soaking a glass fiber fabric with an epoxy resin and being subjected to thermosetting treatment to thereby forming a plate shape. In the glass epoxy substrate, a positional relationship between the glass fiber and the epoxy resin is not uniform in a thickness direction. That is, there are a portion in which the glass fiber is close to a surface of the glass epoxy substrate (an epoxy resin layer is thin) and a portion in which the glass fiber is in a deep part of the glass epoxy substrate (an epoxy resin layer is thick), depending on a position of the glass epoxy substrate. A hole diameter of epoxy resin processed with the laser beam 2 is measured with the hole processed at thick portion of the insulation layer after removing a surface copper layer by etching. In this case, the measured hole diameter corresponds to a diameter of the energy level k. In addition, the hole diameter is measured after shooting the thin portion of the epoxy resin layer by the laser beam 2. In this case, the measured hole diameter corresponds to the diameter of the energy level g. In this case, the glass fiber allows the diameter of the hole processed into a circle to be measured on an outer edge of the hole. It goes without saying that a diameter of the energy level j is obtained by the window diameter.

For example, in a case of the printed circuit board with a build-up layer having a copper layer with a thickness of 7 μm being subjected to black oxide treatment and an insulating layer with a thickness of 60 μm, the present inventors confirmed that the energy level g and the energy level j are about 5 k and 11 k, respectively. In addition, even in a case of the printed circuit board with a build-up layer having a copper layer with a thickness of 1.5 μm and an insulating layer with a thickness of 40 μm, it is confirmed that the energy level k, the energy level g, and the energy level j have substantially the same relationship as in the above case.

Figure 5A:
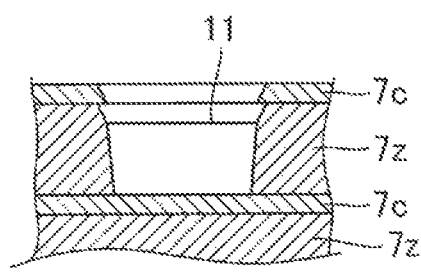
FIG. 5A is a section view of a printed circuit board whose insulating layer is processed by a laser beam passing through the same aperture used in processing the front side copper layer.
Figure 5B:
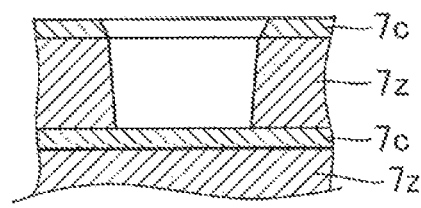
FIG. 5B is a section view of a printed circuit board processed according to the present embodiment.

FIGS. 5A and 5B are cross-sectional views of a laser-processed hole shape. FIG. 5A illustrates a case where the insulating layer 7z is processed by the aperture 4s which processes the front side copper layer 7c as in the prior art, and FIG. 5B illustrates a case where the insulating layer 7z is processed by the aperture 4As such that a diameter of the energy distribution curve on an inlet side of the insulating layer 7z is equal to the window diameter as in the present application, respectively.

A high-temperature vaporized particle of insulator just under the front side copper layer 7c generated by first and after pulse energy during insulating layer removal supplied on the outer periphery of the window is prevented splash out from the hole (stay in the hole). As a result, in a case of the prior art, the recess 11 just under the front side copper layer 7c is expanded and the hollow connected to the recess 11 was formed as illustrated in FIG. 5A in some cases. However, in a case of the present technology, since an area of the approximate triangle PBQ as illustrated in FIG. 4 is much smaller than the approximate triangle PBC, the hollow hardly occurs in an area under the bottom surface of the front side copper layer 7c around the window as illustrated in FIG. 5B. Further, since the hollow hardly occurs, no peeling or a fine crack occurs between the front side copper layer 7c and the insulating layer 7z. Therefore, the recess 11 generated under the front side copper layer 7c is not increased even when the diameter of the hole to be processed in the insulating layer is the same as the window diameter. In addition, since a P-P cross section is the mew level g in which glass fiber is vaporized, the glass fiber as well as the insulator does not remain in the hole.

Hereinafter, results that a thickness of the copper layer subjecting the surface to black oxide treatment is 7 μm and the printed circuit board 7 having the insulating layer with a thickness of 60 μm is actually processed, will be described for reference.

First, the front side copper layer 7c was processed by one pulse with the pulse width Pw of 5 μs (in this case, pulse energy is about 6 mJ) using the aperture 4s having a diameter of 3.4 mm to form a window having a diameter of 65 μm. Next, the insulating layer 7z was processed by three pulses with the pulse width Pw of 3 μs (in this case, pulse energy is about 2.5 mJ) using the aperture 4As having a diameter of 2.6 mm so that the diameter of the energy level g in the outer edge of the window is 65 μm. As a result, it was confirmed that a uniform truncated cone-shaped hole can be processed, the uniform truncated cone-shaped hole having no recess 11 regardless of the unevenness of the glass fiber density, a diameter of the insulating layer under the front side copper layer of about 75 μm (an overhang of the front side copper layer 7c is 5 μm), and a hole bottom diameter of 60 μm or more.

In addition, energy irradiated in the vicinity of the window at the time of the processing the insulating layer 7z was reduced about 60%, as compared with prior art, such that peeling or a crack hardly occurred between the front side copper layer and the insulating layer. In addition, since the deformation during the processing by heat is less deformed, a hole having no position shift between the window and the hole bottom could be formed. In addition, the uniform truncated cone-shaped hole was obtained in the insulating layer 7z, and as a result, it was confirmed that pitch of the hole diameter can be achieved by twice the hole diameter. Further, when the through-hole is formed in the printed circuit board, since the shape of the front and rear surfaces are uniformly symmetrical and variation in the diameter of the intermediate portion of the hole is small, the plated finish surface becomes uniform. As a result, the overhang of the front side copper layer 7c in the vicinity of the window is reduced about 3 μm due to half-etching ahead of the plating process (the front side copper layer 7c is removed slightly more than half the thickness of the front side copper layer by etching) thereby omitting a dedicated removal work of the overhang of the front side copper layer 7c, and thus an effect capable of simplifying an operation process of the plating could be confirmed.

In a case of the prior art, the window was formed by one-pulse with a pulse width of 5 μs using an aperture having a diameter of 3.4 mm, and then a hole having a diameter of 65 μm which is equal to the window diameter was formed in the insulating layer 7z by six-pulse with the pulse width Pw of 1.5 μs. No recess 11 occurred in a portion having a high density glass fiber and a few recess 11 occurred in a portion having a low density in glass fiber and high resin ratio. However, the diameter thereof was around 80 µm (the overhang of the front side copper layer 7c is 7.5 µm), which was almost the same level as the present application.

On the other hand, in a case of the prior art, the window was formed by one-pulse with a pulse width of 5 µs using an aperture having a diameter of 3.4 mm, and then a hole having a diameter of 65 µm which is equal to the window diameter was formed in the insulating layer 7z by three-pulse with the pulse width Pw of 3 µs. The recess 11 occurred in both of the portion having a high density in glass fiber and a portion having a low density in glass fiber, the diameter was around 95 µm (the overhang of the front side copper layer 7c is 15 µm) in a case of the portion having a low density in glass fiber, and furthermore, the variation in shape was increased. The overhang of the front side copper layer 7c is about 10 µm or more after the half-etching, such that it was confirmed that there is a possibility that the many voids occur in the plating processing.

Next, results that the printed circuit board having the front side copper layer, not being subjected to surface treatment, with 1.5 µm thickness and the insulating layer with 40 µm thickness is actually processed, will be described.

A window having a diameter of 65 µm was formed by one-pulse with a pulse width of 5 µs using an aperture having a diameter of 3.4 mm. Thereafter, it was confirmed that the uniform truncated cone-shaped hole can be processed by one-pulse with the pulse width Pw of 3 µs using an aperture having a diameter of 2.6 mm, the uniform truncated cone-shaped hole having no recess 11 regardless of the glass fiber density, a diameter of the insulating layer under the front side copper layer of about 75 µm (overhang of 5 µm), and a hole bottom having a diameter of 60 µm or more, Next, result of shortening of processing time will be described.

As described above, a time for positioning the galvanometer mirrors 5a and 5b is about 0.4 ms (2.5 kHz) in average. Therefore, if the processing of the insulating layer 7z is reduced from six pulses to three pulses, a positioning time of the galvanometer mirrors 5a and 5b is reduced by half, and thus in a case where, for example, the number of holes of one printed circuit board is 800,000, the processing time can be shortened by about 40%.

Figure 6:
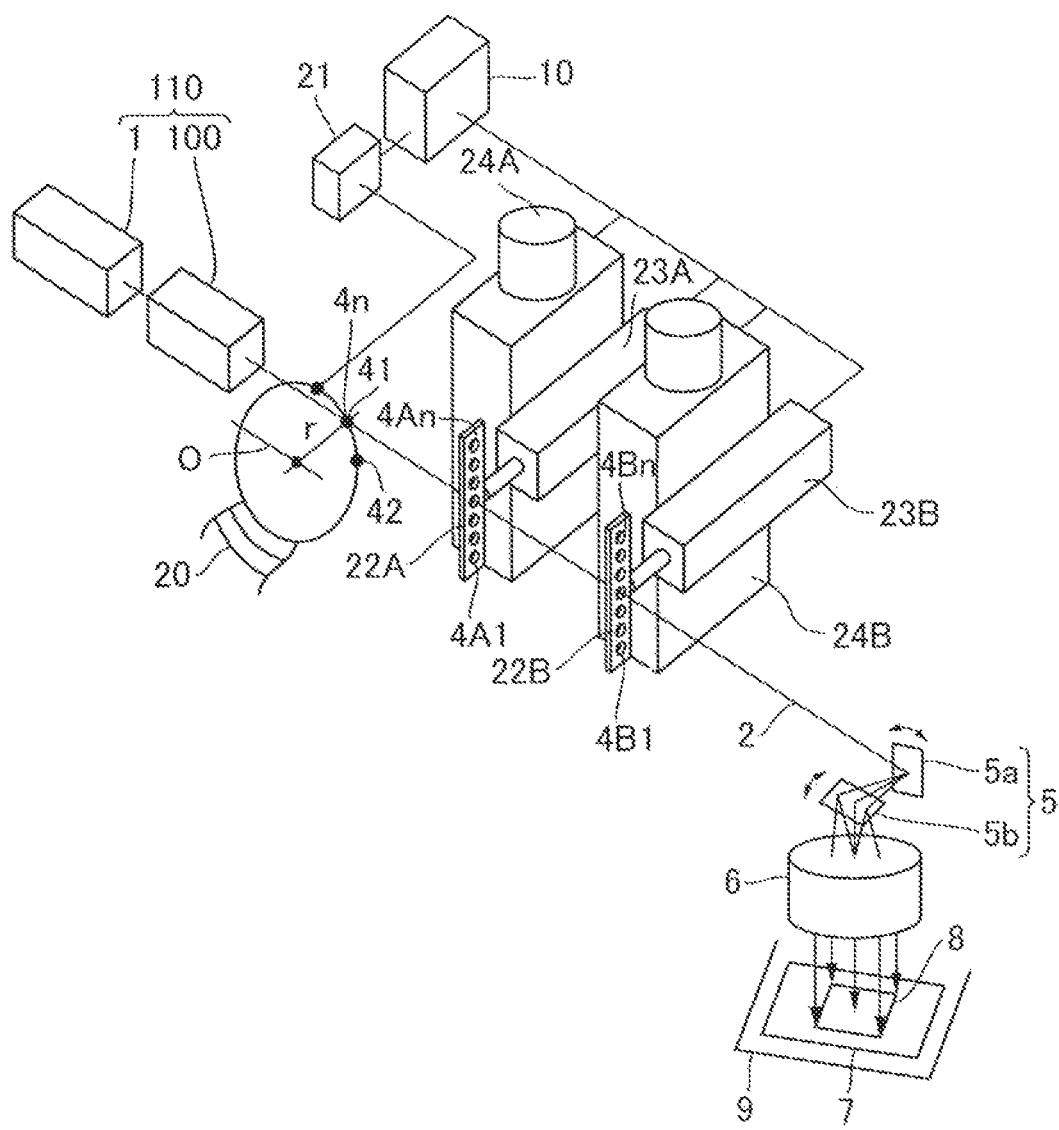
FIG. 6 is an overall view of a second laser processing machine in order to implement the present invention.

FIG. 6 is an overall view of a second laser processing machine in order to implement the present invention, the same object in FIG. 1 or an object having the same function is denoted by the same reference numeral, so the detailed description thereof will not be repeated.

The plate 22B including apertures 4B1 to 4Bn having the same number of the apertures 41 to 4n is arranged between the plate 22A and the galvanometer mirror or 5a in the axial direction of the laser beam 2.

A hole diameter of each of the apertures 4B1 to 4Bn is smaller than a hole diameter of each of the corresponding apertures 4A1 to 4An. The plate 22B is supported by a first linear motion device 23B which has the same structure as the first linear motion device 23A. The plate 22B is positioned at a position (operation position) where one of the axes in the apertures 4B1 to 4Bn in one moving end of the first linear motion device 23B is coaxial with the axis of the laser beam 2. In addition, the plate 22B is positioned at a position (retreat position) where it does not interfere with the laser beam 2 in the other moving end of the first linear motion device 23B.

The first linear motion device 23B is supported by a second linear motion device 24B which has the same structure as that of the first linear motion device 24A. The second linear motion device 24B is positioned at a position where one of the axes in the apertures 4B1 to 4Bn, which is in the operation position, is coaxial with the axis of the laser beam 2. That is, a positioning device of the apertures 4B1 to 4Bn is constituted by the first linear motion device 23B and the second linear motion device 24B. The first linear motion device 23B and the second linear motion device 24B are connected to the control device 10, respectively.

That is, in the present embodiment, a plurality of second plates and a plurality of second plate positioning devices are provided, and specifically, the plate 22B is provided as a second plate in addition to the above-described plate 22A. In addition, the first linear motion device 23B and the second linear motion device 24B are provided in addition to the first linear motion device 23A and the second linear motion device 24A. That is, considering a case where there is one second plate, the laser processing machine includes m (where, m is a positive integer) second plates including n (where, n is a positive integer) apertures, and an outer diameter of the laser beam 2 can be shaped into a size of n×m by the m second plates.

Next, an operation of a second laser processing machine for implementing the present invention will be described.

Figure 7:
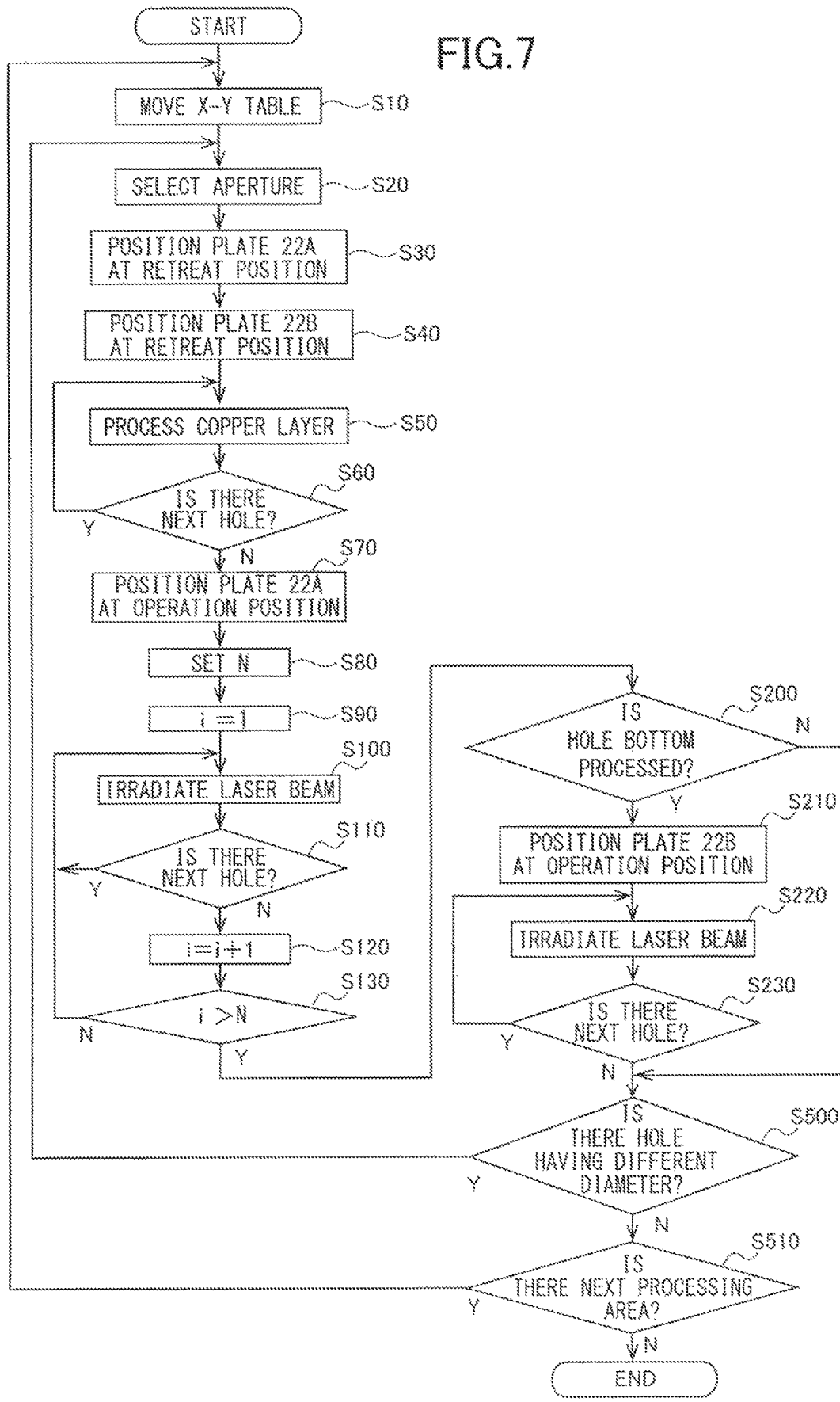
FIG. 7 is a flowchart illustrating a processing procedure of the second laser processing machine according to the present invention.

FIG. 7 is a flowchart illustrating a processing procedure of the second laser processing machine according to the present invention. A procedure same as that of the first laser processing machine will be described simply.

The control device 10 reads a processing program and moves the X-Y table 9 to face an initial scanning area 8 to the fθ lens 6 (procedure S10). In addition, the aperture of the large plate 20 corresponding to a diameter of the hole processed first in an initial scanning area 8 is selected (at least one of the apertures 41 to 4n), and an axis of the aperture is positioned coaxially with an axis of the laser beam 2 (procedure S20). In addition, at the time of positioning the plate 22A at the operation position, the second linear motion device 24A is operated so that the axis of the aperture used at the time of processing the insulator in the apertures 4A1 to 4An coincides with the axis of the laser beam 2, and the plate 22A is positioned at the retreat position (procedure S30). In addition, at the time of processing the plate 22B at the operation position, the second linear motion device 24B is operated so that the axis of the aperture used at the time of processing the insulator in the apertures 4B1 to 4Bn coincides with the axis of the laser beam 2, and the plate 22B is positioned at the retreat position (procedure S40). The apertures 4B1 to 4Bn used for processing, whose diameters are smaller than diameters of the apertures 4A1 to 4An used for processing, are selected. Similar to the prior art, the window is formed by shooting the laser beam 2 by one pulse (that is, one-pulse shot), and the front side copper layer 7c of a hole remaining in the scanning area 8 is processed (procedures S50 and S60). After the processing of the front side copper layer 7c is ended, the plate 22A is positioned at the operation position, that is, an axis of one aperture among the apertures 4A1 to 4An using when the insulator is processed coincides with the axis of the laser beam 2 (procedure S70), and the window portion insulating layer 7z in the scanning area 8 is processed to form a hole (procedures S80 to S130). Then, after the processing of the window portion insulating layer 7z in the scanning area 8 is ended, it is checked whether or not the hole bottom is processed (procedure S200). When the hole bottom is not processed, procedure S500 is performed and when the hole bottom is processed, the plate 22B is positioned at the operation position, that is, the axis of one aperture selected in advance among the apertures 4B1 to 4Bn coincides with the axis of the laser beam 2 (procedure S210). After the entire processing is ended, the hole bottom in the scanning area 8 is shot by the laser beam 2 by one pulse, thereby additionally processing the hole bottom of the processed hole (procedures S220 and S230). After the processing of the hole bottom in the scanning area 8 is ended, it is checked whether or not there are unprocessed holes having different diameters in the scanning area 8 (procedure S500), and if there is an unprocessed hole, an operation of procedure S20 is performed. In addition, it is checked whether or not there is an unprocessed scanning area 8 if there is no unprocessed hole (procedure S510), and if there is an unprocessed scanning area 8, an operation of procedure S10 is performed, and if there is no unprocessed scanning area 8, the processing is ended.

Thus, since the hole bottom is processed by the aperture 4Bn having a smaller diameter than the aperture 4An, it is possible to make the diameter of the hole bottom more uniform.

In addition, this processing method is effective for through-hole processing of X shape in which a hole diameter of the intermediate portion is small. That is, the hole from one side of double-sided board to the intermediate portion is processed first, and after that, the double-sided board is reversed and the hole from the other side to the intermediate portion is processed. Finally, if the intermediate portion of the hole is processed by procedures S210 to S230, variation in the hole diameter of the intermediate portion can be reduced, and also a quality in a hole wall surface of the intermediate portion can be improved.

In this embodiment, since each of the plate 22A and the plate 22B includes an aperture which has the same number as the aperture of the large plate 20, the aperture is easily managed. In this embodiment, the apertures 4A1 to 4An of the plate 22A and the apertures 4B1 to 4Bn of the plate 22B are arranged in a row, but it can be appropriately changed in, such as arranged in two rows.

In this embodiment, the first linear motion devices 23A and 24B are arranged in the axial direction of the laser beam 2, but the first linear motion devices 23A and 24B may be arranged around the axis of the laser beam 2.

In the first and second embodiments, the number of apertures 4A1 to 4An and the number of apertures 4B1 to 4Bn are the same as the number of apertures 41 to 4n, but in a case where the diameter of the hole to be processed is 100 µm or more, plating easily reaches the hole bottom formed on the insulating layer 7z, and thus the number of apertures 4A1 to 4An or the number of apertures 4B1 to 4Bn may be reduced so as to process the hole having a diameter of 210 µm or the hole having a diameter of 190 µm by a 200 µm aperture.

Meanwhile, the surface of the bottom copper layer which is disposed below the insulating layer and is exposed in the hole bottom is roughened for improving adhesion strength with the insulating layer (referred to as tear-off strength peeling strength). Therefore, an absorptivity of the laser beam 2 may be increased, an energy level in the vicinity of the axis $O_L$ may be large (although much smaller than the energy level j), and the surface may be melted. If the surface of the bottom copper layer is melted, since there is a possibility that the insulating layer on the rear surface of the bottom copper layer deteriorates, it is necessary to avoid the melting of the surface of the bottom copper layer of the hole bottom.

Figure 8:
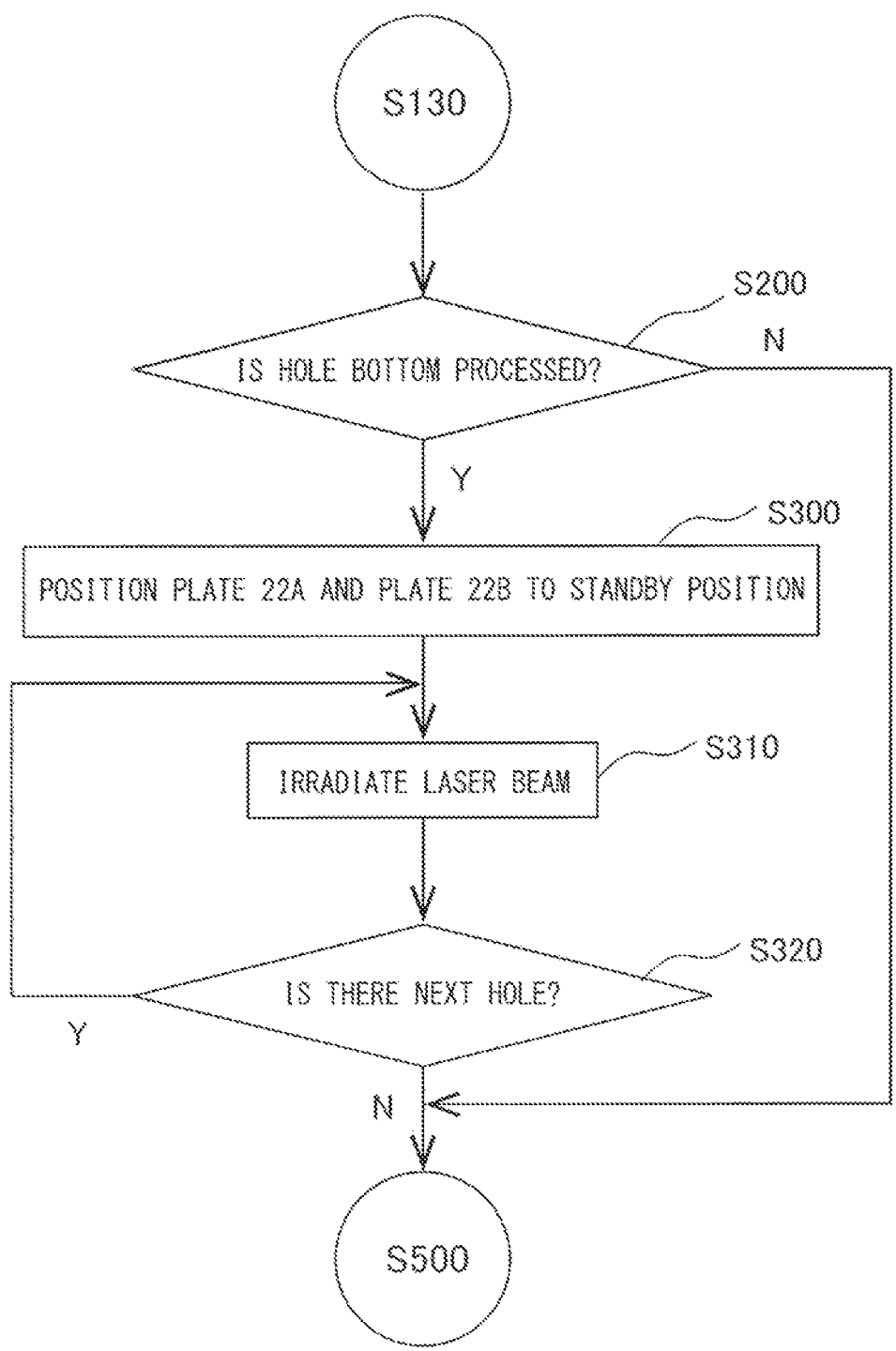
FIG. 8 is a flowchart illustrating a second procedure of processing hole bottom according to the present invention.
Figure 9:
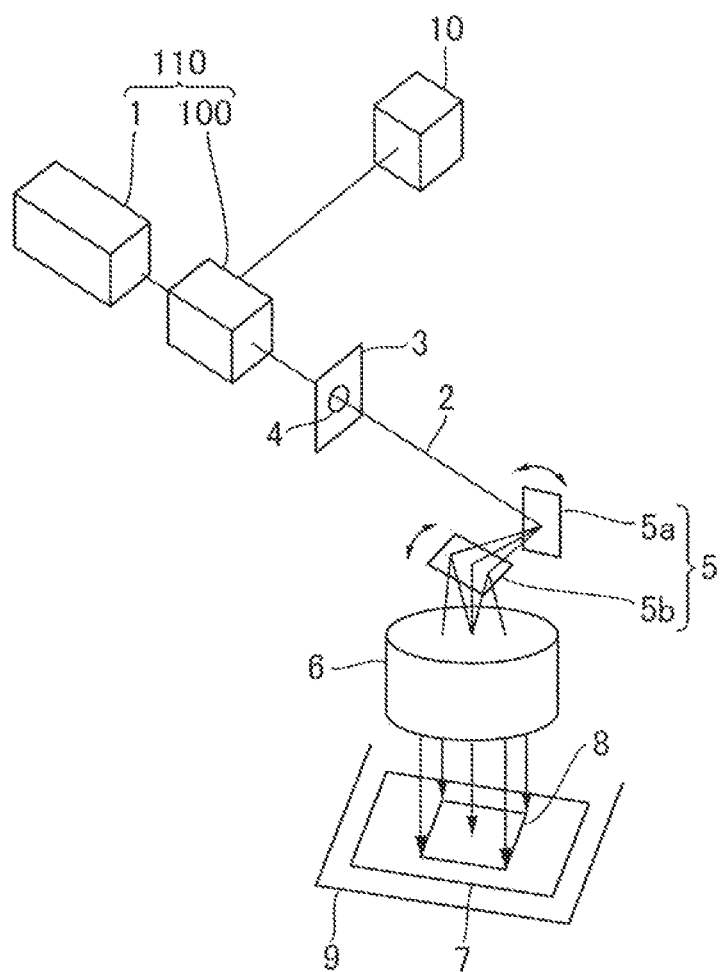
FIG. 9 is an overall view of a laser processing machine in the prior art.
Figure 10:
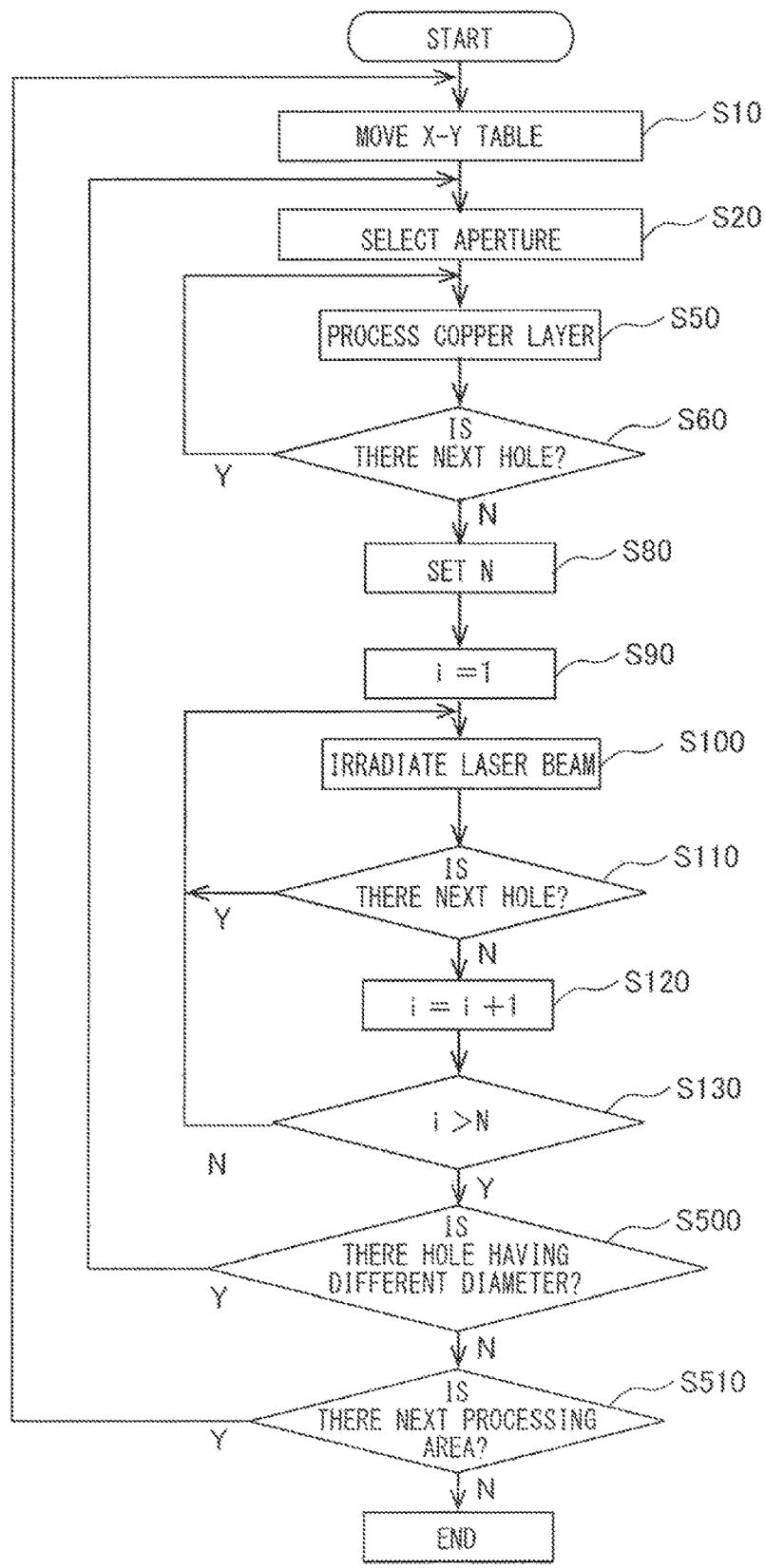
FIG. 10 is a flowchart illustrating a processing procedure of a laser processing machine in the prior art.
Figure 11:
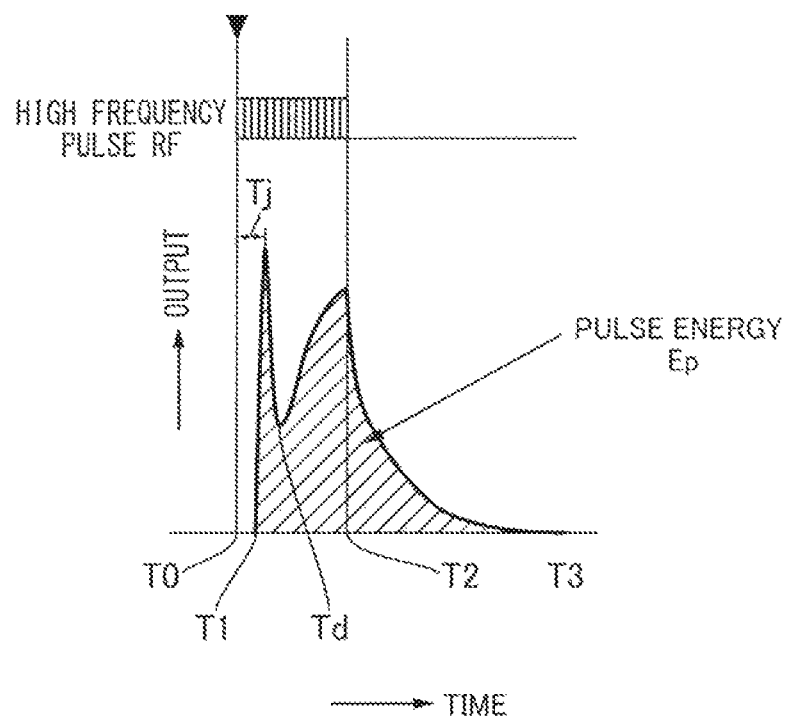
FIG. 11 is a graph explaining an output of a laser oscillator.
Figure 12A:
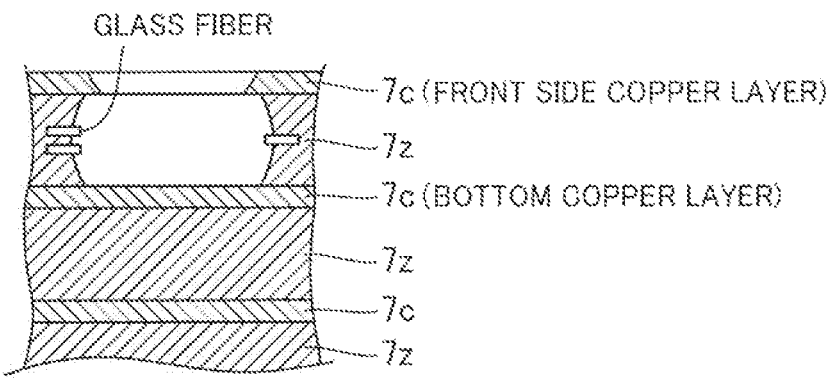
FIG. 12A is a cross-sectional view illustrating an example of a shape of hole formed by laser processing.
Figure 12B:
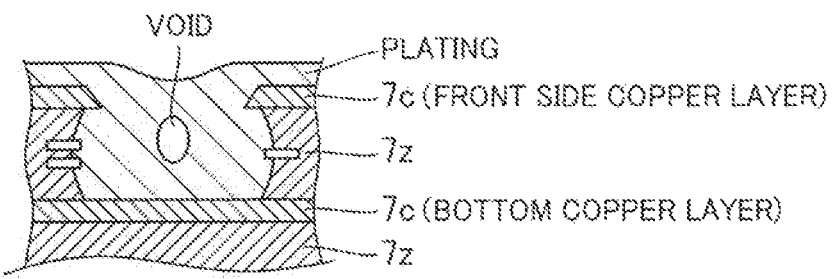
FIG. 12B is a cross-sectional view illustrating an example of a shape of hole formed by laser processing.
Figure 12C:
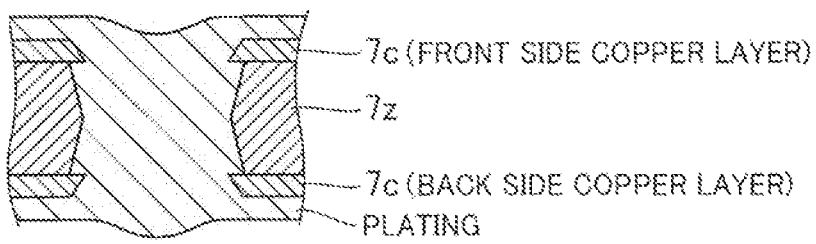
FIG. 12C is a cross-sectional view illustrating an example of a shape of hole formed by laser processing.
Figure 12D:
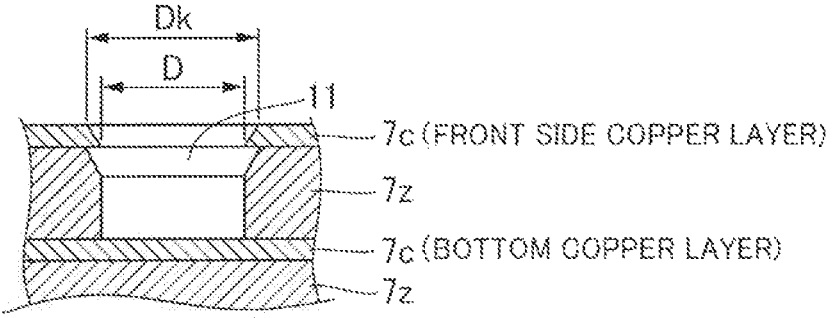
FIG. 12D is a cross-sectional view illustrating an example of a shape of hole formed by laser processing.

FIG. 8 illustrates a second procedure of processing of hole bottom in a case where the hole bottom is processed, a case where the thickness of the bottom copper layer 7c is thin (particularly, 7 to 9 µm) is preferable, and it can be applied to any of the laser processing machines of the present application illustrated in FIGS. 1 and 6. Processes of procedures S10 to S130 and processes of procedures S500 and S510 are the same flowcharts as illustrated in FIGS. 2 and 7, and thus the repeated description will be omitted.

After the processing of the window portion insulating layer 7z in the scanning area 8 is ended, it is checked whether or not the hole bottom is processed (procedure S200). In a case where the hole bottom is not processed, procedure S500 is performed and in a case where the hole bottom is processed, the plate 22A and the plate 22B (in a case of FIG. 1, only the plate 22A) return to a retreat position (procedure S300). After the entire processing is ended, the hole bottom in the scanning area 8 is shot by the laser beam 2 by one pulse, thereby additionally processing the hole bottom of the processed hole (procedures S310 and S320). After the processing of the hole bottom in the scanning area 8 is ended, it is checked whether or not there are unprocessed holes having different diameters in the scanning area 8 procedure S500), and if there is an unprocessed hole, an operation of procedure S20 is performed. In addition, it is checked whether or not there is an unprocessed scanning area 8 if there is no unprocessed hole (procedure S510), and if there is an unprocessed scanning area 8, an operation of procedure S10 is performed, and if there is no unprocessed scanning area 8, the processing is ended. In a case of the embodiment, since the aperture 4s processing the front side copper layer is used as an aperture processing the hole bottom, an operation for reducing an energy density is facilitated, which is advantageous. In procedure S310, it is effective to determine an energy distribution curve so that the hole bottom is the energy level g.

Here, differences between a technique in the present invention and a technique in JP-A-2000-84692 will be described.

The diameter of the hole to be processed in the printed circuit board 7 is 40 µm to 250 µm in most cases. For example, in a case where the hole of 50 µm is processed, the aperture having a hole diameter of 2 mm is adopted, and in a case where the hole of 250 µm is processed, an aperture having a hole diameter of 8 mm is adopted, respectively. In a case of a technique described in JP-A-2000-84692, since even in a case where the hole of 50 µm is processed, the laser beam which has a diameter of 8 mm and passes through the aperture having the largest diameter is supplied to the plate including the aperture processing hole of 50 µm, it is necessary to make a cooling device of each plate large. On the other hand, in the present invention, since the outer diameter of the laser beam 2 processing the front side copper layer 7c is limited by the large plate 20 to process the insulating layer 7z by the laser beam 2 in which the outer diameter is limited, energy supplied to the plates 22A and 22B is reduced. As a result, the cooling device cooling the plates 22A and 22B can be reduced.

In this embodiment, a case where the laser beam 2 is carbon dioxide laser beam is described, but the laser beam 2 may be other laser beams. In addition, a case of processing the front side copper layer by one pulse is described, but the front side copper layer may be processed by a plurality of pulses with short pulse widths Pw (for example, a picosecond pulse and a femtosecond pulse).

The diameter of the laser beam 2 processing the insulating layer 7z is a diameter of the laser beam 2 processing the front side copper layer 7c or less, as described above, but since the mass or volume of insulating layers 7z may be larger than that in the prior art in a case of making one hole, the number of laser shots is decreased in a case of making one hole. As described later, since the pulse width Pw becomes larger even in the same energy level, not only the stable processing result can be obtained, but also the number of laser shots can be reduced in a case of making a hole. As a result, variation in the diameter of the hole formed in the window and insulating layer $7z$ is ±5% or less, the bottom diameter of a hole formed on the insulating layer $7z$ is 80% or more of the diameter of the window, and the hole wall surface is made smooth so that glass fiber does not protrude to the hole wall surface, which are possible. Thus, the processing time can be shortened and the thermal deformation of the printed circuit board is reduced, and thus the processing accuracy is improved.

In addition, the hollow of the insulating layer $7z$ is 7.5 μm or less, the peeling between the front side copper layer $7c$ in the vicinity of the window and the insulating layer $7z$ or the crack of the insulating layer $7z$ is reduced, the hole diameter is further reduced, and a distance between adjacent holes is about two times the hole diameter, which are possible. Thus, a mounting density of the printed circuit board can be increased.

In addition, since variation and deviation in the diameter of the intermediate portion of the hole when the through-hole are formed, a quality of the printed circuit board is improved.

Further, by providing a process in which the bottom surface of a blind hole, i.e. the exposed bottom copper layer in the blind hole, is finished, the hole diameter is uniform, and thus the smaller blind hole can be achieved.

In addition, the diameter of the hole to be processed in the insulating layer $7z$ coincides with the window diameter even in a case where the diameter of the processed hole is reduced, thereby processing a hole having excellent quality.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A manufacturing method for a printed circuit board, the manufacturing method comprising:
   passing a first laser beam output from a laser output device through a first aperture so as to define an outer diameter of the first laser beam, then positioning the first laser beam by an optical axis positioning device including a galvano device and an fθ lens, and then irradiating the printed circuit board with the first laser beam such that a through-hole is formed in a copper layer of the printed circuit board; and
   passing a second laser beam output from the laser output device through a second aperture so as to define an outer diameter of the second laser beam whereby a diameter of the second aperture is smaller than a diameter of the first aperture, then positioning the second laser beam by the optical axis positioning device, and then irradiating the printed circuit board with the second laser beam such that an insulating layer of the printed circuit board is processed by the second laser beam,
   wherein a pulse width of the second laser beam is controlled such that an energy level of the second laser beam at the through-hole becomes an energy level contributing to the processing of the insulating layer and the outer diameter of the second laser beam at the through-hole becomes equal to a diameter of the through-hole.

2. The manufacturing method according to claim 1, wherein:
   the copper layer is a front surface copper layer or a back surface copper layer;
   the printed circuit board is a double-sided board including the front surface copper layer and the back surface copper layer and the through-hole includes a first hole processed from the front surface copper layer to an intermediate portion of the double-sided board in a thickness direction of the double-sided board and a second hole processed from the back surface copper layer to the intermediate portion of the double-sided board in the thickness direction of the double-sided board, and the diameter of the through-hole at the intermediate portion of the double-sided board is smaller than a diameter of the first hole at the front surface copper layer and a diameter of the second hole at the back surface copper layer; and
   the manufacturing method further comprises finishing an inner surface of printed circuit board adjacent to the through-hole by a third laser beam, the third laser beam being passed through a third aperture so as to define an outer diameter of the third laser beam whereby a diameter of the third aperture is smaller than the diameter of the second aperture.

* * * * *